United States Patent [19]

Hongu et al.

[11] 4,263,675

[45] Apr. 21, 1981

[54] AFT CIRCUIT

[75] Inventors: Masayuki Hongu, Kawasaki; Shigeru Ohmuro, Higashimine; Masaharu Tokuhara, Tokyo, all of Japan

[73] Assignee: Sony Corporation, Tokyo, Japan

[21] Appl. No.: 88,852

[22] Filed: Oct. 29, 1979

[30] Foreign Application Priority Data

Nov. 2, 1978 [JP] Japan ................................ 53-135486

[51] Int. Cl.³ .............................................. H04B 1/16
[52] U.S. Cl. ................................... 455/192; 455/202; 358/195.1; 334/16
[58] Field of Search ............... 455/208, 260, 173, 170, 455/182, 183, 184, 185, 192, 195, 150, 164, 261, 262; 358/195.1, 191.1, 158; 334/11, 16

[56] References Cited

U.S. PATENT DOCUMENTS

| 3,069,637 | 12/1962 | Seeley | 455/261 |
| 3,824,474 | 7/1974 | Sakamoto | 455/182 |
| 3,922,609 | 11/1975 | Grohmann | 455/192 |
| 3,939,427 | 2/1976 | Mueller | 455/173 |
| 3,987,399 | 10/1976 | Yokoyama | 455/261 |
| 4,005,256 | 1/1977 | Arumugham | 455/182 |
| 4,079,320 | 3/1978 | Mogi | 455/182 |

Primary Examiner—Robert L. Griffin
Assistant Examiner—Tommy P. Chin
Attorney, Agent, or Firm—Lewis H. Eslinger; Alvin Sinderbrand

[57] ABSTRACT

An automatic fine tuning (AFT) circuit includes a frequency discriminator for discriminating an intermediate frequency signal, a capacitor supplied with the discriminated intermediate frequency signal to produce an AFT voltage thereacross, a comparator circuit for comparing the AFT voltage with a reference voltage, a first switching transistor controlled by the comparator circuit and which supplies and charges the capacitor with the reference voltage during a channel selection operation when the AFT voltage is less than the reference voltage, a second switching transistor controlled by the comparator circuit and which connects the capacitor to ground to discharge the same during a channel selection operation when the AFT voltage is greater than the reference voltage, and a third switching transistor for rendering the comparator circuit operative during a channel selection operation and inoperative during an AFT operation.

8 Claims, 4 Drawing Figures

AFT CIRCUIT

BACKGROUND OF THE INVENTION

1. Field of the Invention

This invention relates generally to an AFT (automatic fine tuning) circuit and, more particularly, is directed to an AFT circuit for use with a television receiver which utilizes an electronic tuner.

2. Description of the Prior Art

In prior art, television receivers, an example of which is shown in FIG. 1 a received video signal is passed through a high frequency amplifier 1, a mixer 2, a band pass filter 3, a video intermediate frequency amplifier 4 and a video detector 5. As shown, the television receiver further includes an AFT (automatic fine tuning) circuit 6 which supplies an A2 AFT voltage to a local oscillator 7 which controls the output from mixer 2. AFT circuit 6 includes a frequency discriminator circuit 8 which detects the frequency fluctuation in the VIF (video intermediate frequency) signal from amplifier 4 and a DC amplifier 9 which amplifies the discriminated output from frequency discriminator circuit 8 to provide the AFT voltage. The frequency drift of the output signal from local oscillator 7 is thus suppressed by the AFT voltage to automatically achieve fine tuning.

To avoid erroneous operation of the AFT circuit during start-up or the like, the AFT operation is temporaily halted when the output from the power source of the television receiver is increased, during channel switching and so on, the haulting operation being termed generally AFT defeat.

In prior art tuners of the mechanical selection type, such as of the turret or, rotary switch type, in which the tuner shaft is rotated to switch a receiving channel, the AFT defeat and the release thereof after channel switching is effected is carried out by switching a contact between its ON and OFF positions. However, such a method can not be applied to an electronic tuner in which a variable reactance element, such as a variable capacitance diode or the like, is used.

This can more readily be seen with reference to a prior art AFT circuit for an electronic tuner an example of which is shown in FIG. 2. In this circuit, transistors Q1 to Q7 form a frequency discriminator circuit 8 using a phase detector circuit of a double balanced type to which the VIF signal is supplied through input terminals 10a and 10b. More particularly, transistors Q2 and Q3 are switched at the inverse phases of the VIF signal, and the transistor pairs Q4, Q7 and Q5, Q6 are switched at the reverse phases of the VIF signal which has its series resonance frequency shifted by 90° through capacitors 11a and 11b and coil 12. In this case, the series resonance frequency is selected as a video intermediate frequency $f_p$ (58.75 MHz). At output terminals 13a and 13b of frequency discriminator circuit 8, a discriminated output signal is produced which is a multiple of the VIF signal and the phase shifted VIF signal. This output signal from the frequency discriminator circuit 8 is amplified by DC amplifier 9 which includes transistors Q8, Q9, Q11 and diode Q10. Diode Q10 may be connecting the collector and base of a transistor together. The output signal from the DC amplifier 9 is supplied through a low pass filter, which is formed of resistors 14 and 15 and a capacitor 16, to an output terminal 17 of AFT circuit 6, as the AFT voltage.

Referring now to FIG. 3, there is shown therein a graphical representation of the output characteristic of frequency driscriminator circuit 8, represented by S-shaped curve 22. When the output signal, represented by curve 22, is supplied to amplifier 9, it transformed into the AFT voltage having the characteristic shown by curve 23.

However, in an electronic tuner, a plurality of variable resistors are preset in correspondence with respective channels to be received. That is, a variable resistor corresponding to each received channel is selected by a channel selection operation to produce respective tuning voltages which are used to control the frequency of the local oscillator. In FIG. 2, a variable resistor 18 is representative of one of the preset variable resistors and has a first fixed terminal 19 supplied with a DC voltage and a second fixed terminal connected to ground. The output terminal 17, at which the AFT voltage is obtained, is connected to the movable tap of the variable resistor 18 through resistors 20 and 21, and a tuning voltage VC is derived from the junction point between resistors 20 and 21.

In order to preset each of the variable resistors, transistor Q1, serving as a constant current source for frequency discriminator circuit 8, is turned OFF by an AFT switch (not shown). At this time, a reference or relative zero voltage $V_O$ is derived from a voltage source $+V_{cc}$ supplied through a voltage divider comprised of resistors 14 and 15, and is produced at A10 output terminal 17. During the time period in which a television broadcast wave is received, transistor Q1 is turned ON and the AFT voltage, for example, $V_A$ (refer to FIG. 3), is generated to compensate for the shift in carrier frequency of the VIF signal caused by frequency drift in the local oscillator 7 which is due to the temperature characteristic, and the like of local oscillator 7. Under the above state, a channel is selected to receive a television broadcast wave, the reference voltage $V_O$ supplied to terminal 17 equivalently changes toward AFT voltage $V_A$ with the result that an erroneous AFT operation may be effected during such change. To avoid such erroneous AFT operation, an AFT defeat pulse, which is negative for a period of time after the channel is switched is supplied to the base of transistor Q1 to turn transistor Q1, resulting in transistors Q2 to Q11 being turned OFF. Thus, the charge stored in capacitor 16 is discharged through resistor 14 or 15 so that the voltage at output terminal 17 equals reference voltage $V_O$ to avoid the above erroneous AFT operation.

Upon initiation of the AFT defeat, a time period, during which the voltage at output terminal 17 returns to reference voltage $V_O$, is determined by the level of the AFT voltage and the time contant of resistors 14 and 15 and capacitor 16. If the resistances of resistors 14 and 15 and the capacitance of capacitor 16 are given as R14, R15 and respectively, the time constant $\tau$ thereof can be expressed as follows:

$$\tau = \frac{R14 \cdot R15}{R14 + R15} \cdot C16$$

This is generally a long time, that is, greater than 100 ms. The reason is that the time constant $\tau$ is selected so as to sufficiently attenuate the residual FM components of the vertical and horizontal synchronizing pulses in the frequency discriminated output signal. Thus, since the time period within which the voltage at output terminal 17 returns to the reference voltage $V_O$ during AFT defeat is of a relatively long duration, an erroneous operation is likely caused. This means that after a channel is switched, there is generally a long delay before reactivation of the AFT operation.

In order to cure the above defect, another prior art AFT circuit is known and has two terminals at which differential AFT voltages respectively appear. The two terminals are short-circuited by a switching element, such as an FET or the like, to carry out the AFT defeat operation. However, if the reference voltages used in regard to the differential AFT voltages are not equal, there occurs a resultant. Accordingly, it is necessary in the operation of the circuit that a differential amplifier used to produce the differential AFT voltages have no offset or superior characteristics. Further, in order to avoid erroneous operation, the differential outputs from the differential amplifier are respectively supplied to low pass filters with the result that two capacitors are utilized, resulting in substantial delay in operating time.

OBJECTS AND SUMMARY OF THE INVENTION

Accordingly, it is an object of this invention to provide an improved AFT circuit that avoids the above-described difficulties encountered with the prior art.

More particularly, it is an object of this invention to provide an AFT circuit which is adapted to be utilized with a television receiver having an electronic tuner.

Another object of this invention is to provide an AFT circuit in which an AFT defeat operation and release thereof can be carried out at a high speed.

Still another object of this invention is to provide an AFT circuit which is simple yet inexpensive to manufacture.

In accordance with an aspect of this invention, an automatic fine tuning circuit of the type in which a frequency discriminated intermediate frequency signal is supplied to a capacitive element and a voltage across the capacitive element is supplied to a variable reactance element of a tuner as an AFT voltage, includes comparator means for comparing the AFT voltage across said capacitive element with a reference voltage; first switching means controlled by the comparator means so as to form charge path for the capacitive element during a channel selection operation when the AFT voltage is less than the reference voltage; and second switching means controlled by the comparator means so as to form a discharge path for capacitive element during a channel selection operation when the AFT voltage is greater than the reference voltage.

The above, and other, objects, features and advantages of the invention will be apparent in the following detailed description of an illustrative embodiment of the invention which is to be read in connection with the accompanying drawings.

DESCRIPTION OF THE PREFERRED EMBODIMENT

Figure 1:
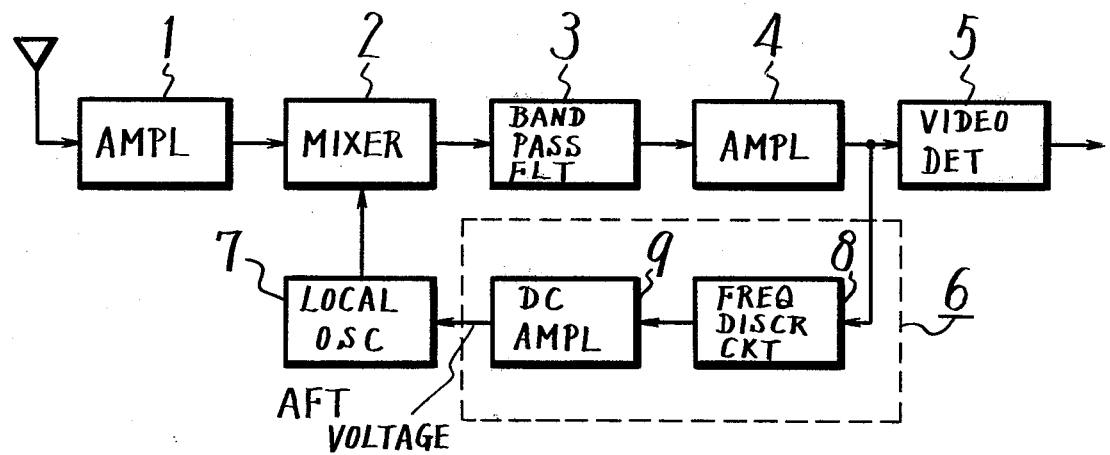
FIG. 1 is a block diagram of a television receiver circuit using a prior art AFT circuit.

Referring to the drawings in detail, and initially to FIG. 4, thereof, one embodiment of an AFT circuit according to the present invention will now be described.

Figure 2:
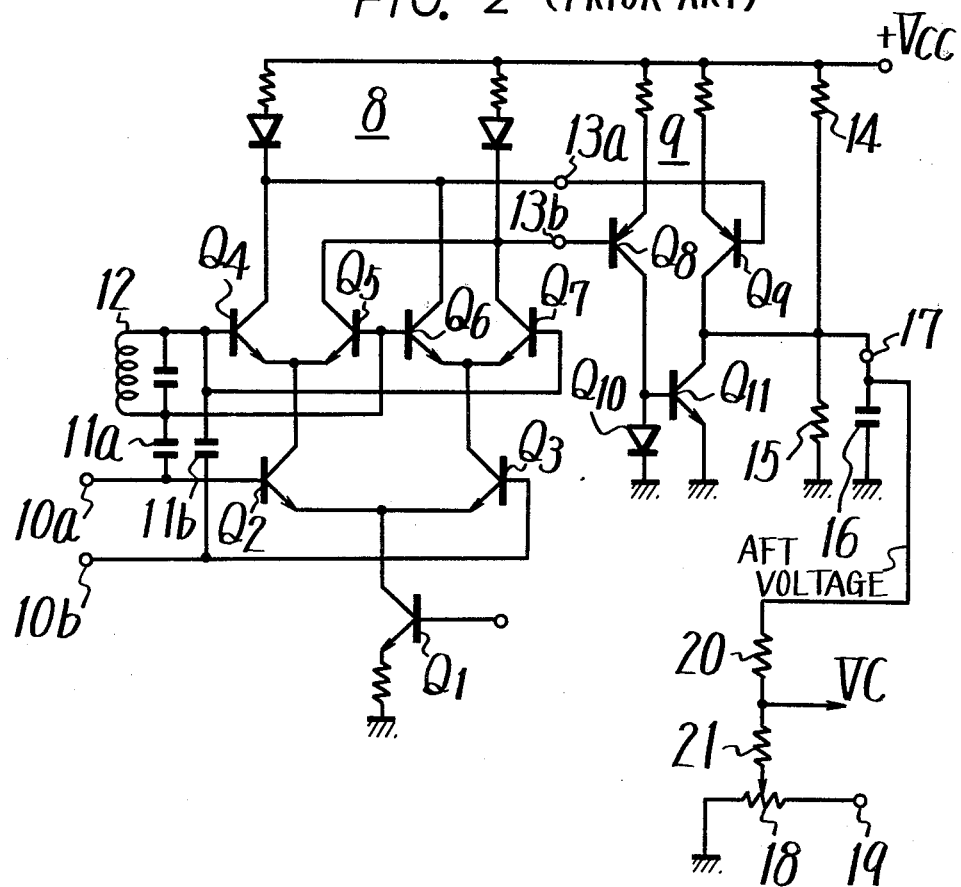
FIG. 2 is a circuit wiring diagram of a prior art AFT circuit that can be used with the television receiver circuit of FIG. 1.
Figure 4:
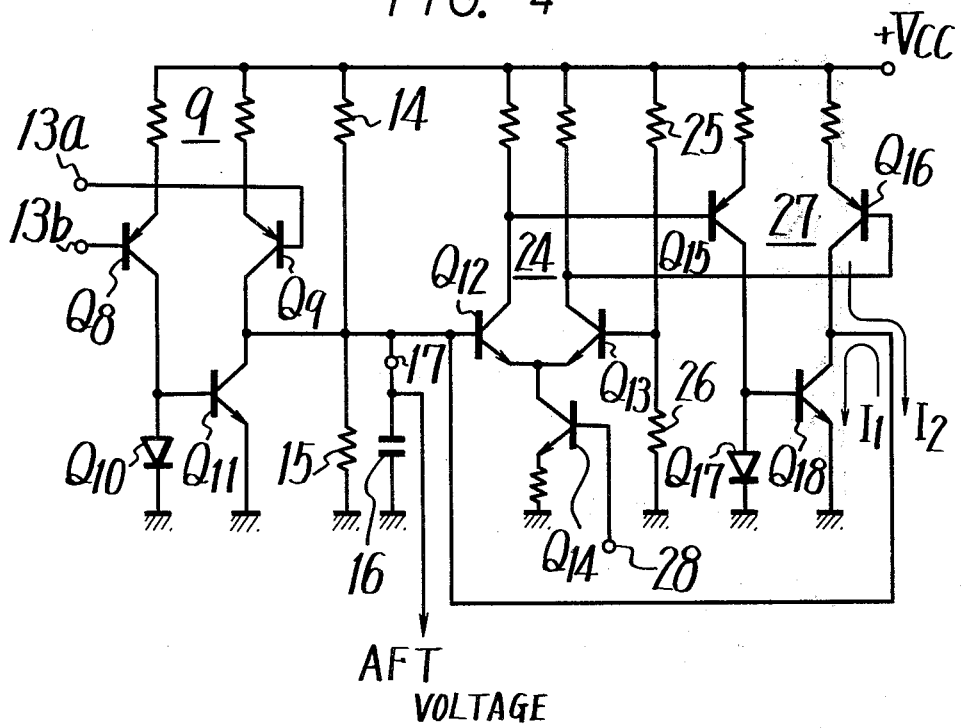
FIG. 4 is a circuit wiring diagram of an embodiment of the AFT circuit according to the present invention.

The embodiment of FIG. 4 is formed of a frequency discriminator circuit 8, a DC amplifier 9 and a low pass filter (consisting of resistors 14 and 15 and a capacitor 16) which are formed similar to the same components in the embodiment of FIG. 2. In FIG. 4, although frequency discriminator circuit 8 is not shown, transistor Q1 thereof serves as a constant current source for frequency discriminator circuit 8 and it and a transistor Q14 are supplied with a predetermined DC voltage to carry out the AFT off operation and AFT defeat operation.

Output terminal 17, at which the AFT voltage appears, is connected to the base of a transistor Q12 which, together with a transistor Q13, forms a differential amplifier 24. The common connection point between the emitters of transistors Q12 and Q13 is connected to a transistor Q14 which serves as a constant current source. A reference voltage equal to reference voltage $V_O$ is obtained by dividing the voltage from voltage source $+V_{cc}$ with resistors 25 and 26 and is supplied to the base of transistor Q13. The differential outputs from differential amplifier 24 are amplified by a DC amplifier 27 which is formed of transistors Q15, Q16 and Q18 and a diode Q17. The collector of transistor Q18, which serves as the output terminal for DC amplifier 27, is connected to the base of transistor Q12 of differential amplifier 24.

A terminal 28 is connected to the base of transistor Q14 and is supplied with a positive voltage when the AFT operation is inoperative and with a defeat pulse which is positive for a predetermined time period during AFT defeat both of which act to turn transistor Q14 ON. When transistor Q14 is turned ON, differential amplifier 24 operates to compare the level of the voltage from terminal 17 with that of reference voltage $V_O$ from the junction point of resistors 25 and 26. The compared output is negatively fed back to the base of transistor Q12 through DC amplifier 27. It is to be realized, of course, that the voltage at output terminal 17 thus becomes equal to $V_O$. However, during the AFT operation, transistor Q14 is turned OFF to to inhibit the operation of the negative feedback loop so that the AFT operation is carried out in a manner similar to that in the prior art embodiment of FIG. 2.

Figure 3:
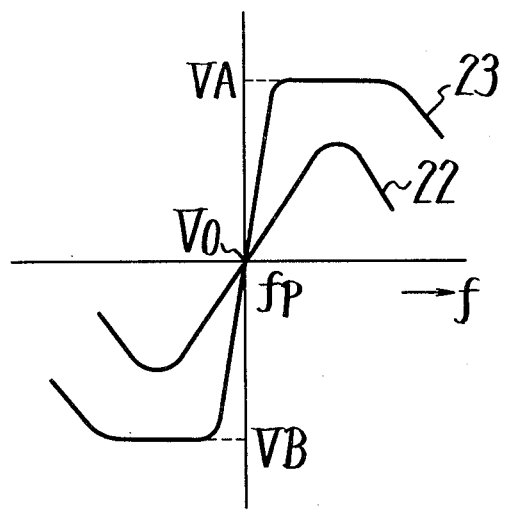
FIG. 3 is a graphical diagram used for explaining the derivation of the AFT voltage.

A description will now be given of the response speed of AFT circuit 6 during the channel switching operation. It is first assumed that an AFT voltage having a level $V_A$ (refer to FIG. 3) is produced at output terminal 17 when a certain channel is selected. When the channel is switched, a positive defeat pulse is supplied to terminal 28 to turn transistor Q14 ON. Substantially at the same time, transistors Q12 and Q13 are also made operative. However, since $V_A \neq V_O$, transistor Q12 turns ON while transistor Q13 remains in its OFF condition. Thus, transistor Q15, diode Q17 and transistor Q18 turn ON and capacitor 16 is instantly discharged by the collector current I1 from transistor Q18 to thereby fix the voltage at output terminal 17 to reference voltage $V_O$. If the discharging time for capacitor 16 is given as t1, the discharging electric charge is expressed as follows.

$$I1 \cdot t1 = C16 \cdot (V_A - V_O)$$
$$\text{so that } t1 = \frac{C16}{I1} \cdot (V_A - V_O)$$

If the channel switching operation is carried out when the AFT voltage is equal to VB (refer to FIG. 3), where $V_O > V_B$, then transistors Q13 and Q16 turn ON. In this case, capacitor C16 is instantly charged by the collector current I2 from transistor Q16 to thereby fix the voltage at output terminal 17 to reference voltage $V_O$ from the junction of resistors 25 and 26. If the charging time is now given as t2, the charging electric charge is expressed as follows.

$$I2 \cdot t2 = C16 \cdot (V_O - V_B)$$
$$\text{so that } t2 = \frac{C16}{I2} \cdot (V_O - V_B)$$

Now, if it is assumed that $I1 = I2 = 2$ mA, $V_A - V_O = V_O - V_B = 5$ V and $C16 = 2.2$ μF, then the time periods $t_1$ and $t_2$ are found as follows:

$$t1 = t2 = 5.5 \text{ ms}$$

Thus, the charging and discharging time of the invention during channel switching is short in comparision with the prior art AFT circuit of FIG. 2. It is to be noted that, since the time constant of the low pass filter of this invention is the same as that of the prior art, the component of the synchronizing signal (residual FM component) contained in the AFT voltage can be sufficiently attenuated by this low pass filter.

Thus, as should clearly be understood from the above description, when a channel is switched, the AFT voltage is returned to the reference voltage $V_O$ in a very short time so that the AFt defeat operation can be positively achieved and so that, after the channel is switched, the AFT operation can be restarted within a very short time.

Further, it is to be appreciated that, since the AFT circuit according to this invention has substantially the same number of pin connections as that of the prior art, the AFT circuit of the invention is suitable for construction as an IC.

Having described a specific preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

We claim as our invention:

1. In an automatic fine tuning circuit of the type in which a frequency discriminated intermediate frequency signal is supplied to a capacitive element and a voltage across said capacitive element is supplied to a variable reactance element of a tuner as an AFT voltage, the improvement comprising:

comparator means for comparing the AFT voltage across said capacitive element with a reference voltage;

first switching means controlled by said comparator means for forming a charge path for said capacitive element during a channel selection operation when said AFT voltage is less than said reference voltage; and second switching means controlled by said comparator means for forming a discharge path for said capacitive element during said channel selection operation when said AFT voltage is greater than said reference voltage.

2. An automatic fine tuning circuit according to claim 1; in which said comparator means includes a pair of transistors having respective emitters, collectors and bases, said emitters are connected together, said AFT voltage is supplied to the base of one of said transistors and the reference voltage is supplied to the base of the other of said transistors.

3. An automatic fine tuning circuit according to claim 1; in which said first switching means includes a first switching transistor for supplying said reference voltage from said comparator means to said capacitive element when said AFT voltage is less than said reference voltage.

4. An automatic fine tuning circuit according to claim 1; in which said second switching means includes a second switching transistor for connecting said capacitive element to ground when said AFT voltage is greater than said reference voltage so as to provide a discharging path therefor.

5. An automatic fine tuning circuit according to claim 1; further including third switching means for rendering said first and second switching means operative during said channel selection operation.

6. An automatic fine tuning circuit according to claim 5; in which said comparator means includes a pair of transistors having respective emitters, collectors and bases, said emitters are connected together, and said third switching means includes a switching transistor having a collector-emitter path connected between ground and the emitters of said pair of transistors, and in which said switching transistor is made operative during said channel selection operation so as to connect the emitters of said pair of transistors to ground through the collector-emitter path of said switching transistor.

7. An automatic fine tuning circuit according to claim 6; in which one of said pair of transistors has the AFT voltage supplied to its base, the other of said pair of transistors has the reference voltage supplied to its base, the first switching means includes a switching transistor having a base connected to said other of said pair of transistors and a collector connected to said capacitive element, and said second switching means includes a switching transistor having a base connected to said one of said pair of transistors and a collector-emitter path connected between ground and said capacitive element.

8. An automatic fine tuning circuit according to claim 1; further including frequency discriminator means for generating said frequency discriminated intermediate frequency signal and wherein said capacitive element includes a capacitor supplied with said frequency discriminated intermediate frequency signal.

* * * * *